United States Patent [19]
Singh et al.

[11] Patent Number: 5,788,765
[45] Date of Patent: Aug. 4, 1998

[54] CRYSTALS FOR ULTRAVIOLET LIGHT FILTERS

[75] Inventors: Narsingh B. Singh; William D. Partlow, both of Export, Pa.; Steven Strauch, Ellicott City, Md.; Albert M. Stewart, Pittsburgh; John F. Jackovitz, Monroeville, both of Pa.; David W. Coffey, Columbia, Md.

[73] Assignee: Northrop Grumman Corporation, Los Angeles, Calif.

[21] Appl. No.: 709,398

[22] Filed: Aug. 30, 1996

[51] Int. Cl.$^6$ .................................................. C30B 7/08
[52] U.S. Cl. ............................. 117/68; 117/3; 117/71
[58] Field of Search ........................... 117/68, 3, 71

[56] References Cited

U.S. PATENT DOCUMENTS

| | | |
|---|---|---|
| 2,615,797 | 10/1952 | Bruzau . |
| 4,087,511 | 5/1978 | Ropp ............................. 423/277 |
| 4,517,048 | 5/1985 | Shlichta ......................... 156/621 |
| 5,499,600 | 3/1996 | Okuno et al. .................... 117/68 |

OTHER PUBLICATIONS

"Low temperature Opitical Absorption of Nickel Fluosilicate Crystals" by M. H. L. Pryce, G. Agnetta, T. Carofano, M. B. Palma-Vittorelli and M. U. Palma, Phil. Mag., 10, 477–496 (1964).

"Derivatographic Studies on Dehydration of Salt Hydrates and Their Deuterium Oxide Analogues, II" by N. Ray Chaudhuri and G. K. Pathak, Thermochimica Acta, 12 (1975) 71–79.

Studies on the Vibrational Spectrum of the $SO_4$=ion in Crystalline $M_2'M''(SO_4)_2 \cdot 6H_2O$ Ananthanarayanan Journal of Chemical Physis vol. 48 #2 (573–581), Jan. 15, 1968.

Optical Absorption Spectra of Diluted $Ni(KSO_4)_2 6H_2O$ Single Crystal Baneyi Indian J. Physic 43 (108–109), 1969.

Primary Examiner—Robert Kunemund
Assistant Examiner—Evelyn Defillo
Attorney, Agent, or Firm—Walter G. Sutcliff

[57] ABSTRACT

Crystals formed of a solid-solution of $K_2Ni(SO_4)_2 6H_2O$ provide very good materials for filtering ultraviolet light and will not deteriorate in temperatures as high as 110° C. They are particularly useful in sensing devices which seek to identify the presence of ultraviolet light in the UV missile warning band.

10 Claims, 2 Drawing Sheets

CRYSTALS FOR ULTRAVIOLET LIGHT FILTERS

FIELD OF INVENTION

The invention relates to crystals having thermal and optical properties suitable for use in ultraviolet light filters and sensors.

BACKGROUND OF THE INVENTION

There are a variety of devices which use ultraviolet (UV) light filters that allow selected wavelengths of light to pass therethrough. Such filters are used in missile approach warning systems which locate and track sources of ultraviolet energy, enabling the system to distinguish the plume of an incoming missile from other UV sources that pose no threat. The benefit of this system is the ability to estimate missile range and closing velocity to time the ejection of flare-decoys to maximize their effectiveness against infrared-guided missiles. This system can be also used to aim a beam of infrared energy at an IR guided missile to confuse its guidance system.

The success and efficiency of the system for helicopters or transport-type aircrafts depends on the UV sensors. Commercially available nickel sulfate hexahydrate crystals are widely used for these sensors. The biggest problem for these sensors arise due to low thermal stability of nickel sulfate crystals. They lose water molecules and the crystals begin deteriorating as the temperature starts rising above 60° C. This rise can be due to atmosphere as well as heat generated by working systems in the aircraft. Aircraft parked in tropical and desert areas can experience very high temperatures. In such heat the stability of these systems is very questionable. There is an urgent need for an ultraviolet filter material with higher temperature stability, good crystal growth suitability, and desired filter transmittance and bandwidths.

The filter should have high transmittance at the desired wavelength in the missile warning band, such band being well known to those skilled in the art. For missile warning systems, the crystal should be transmissive in the ultraviolet spectral region and have strong absorption at longer wavelengths. Furthermore, the crystal should be able to survive prolonged exposures to temperatures above 85° C. and preferably not be adversely affected by temperatures in the range 100° C. to 115° C.

SUMMARY OF THE INVENTION

We provide a crystal comprised of hydrated potassium nickel sulfate $K_2Ni(SO_4)_2 6H_2O$. We have found that $K_2Ni(SO_4)_2 6H_2O$ crystals are stable in temperatures up to 95° C. for indefinite periods. Sufficiently large crystals can be grown that are very useful for UV filters of the type used in missile approach warning systems. Crystals of $K_2Ni(SO_4)_2 6H_2O$ have been successful at withstanding 95° C. for indefinite periods of time under relevant operating conditions and survived at temperatures as high as 110° C. for short periods. The crystal also had the required optical properties including strong absorption at longer wavelengths and it was transmissive in the UV band.

The crystals can be grown using a solution formed by adding $K_2Ni(SO_4)_2 6H_2O$ to a 30:70 solution of HCl and water.

Other objects and advantages of the present invention will become apparent from a description of certain preferred embodiments thereof shown in the accompanying drawings:

DESCRIPTION OF THE PREFERRED EMBODIMENTS

Figure 1:
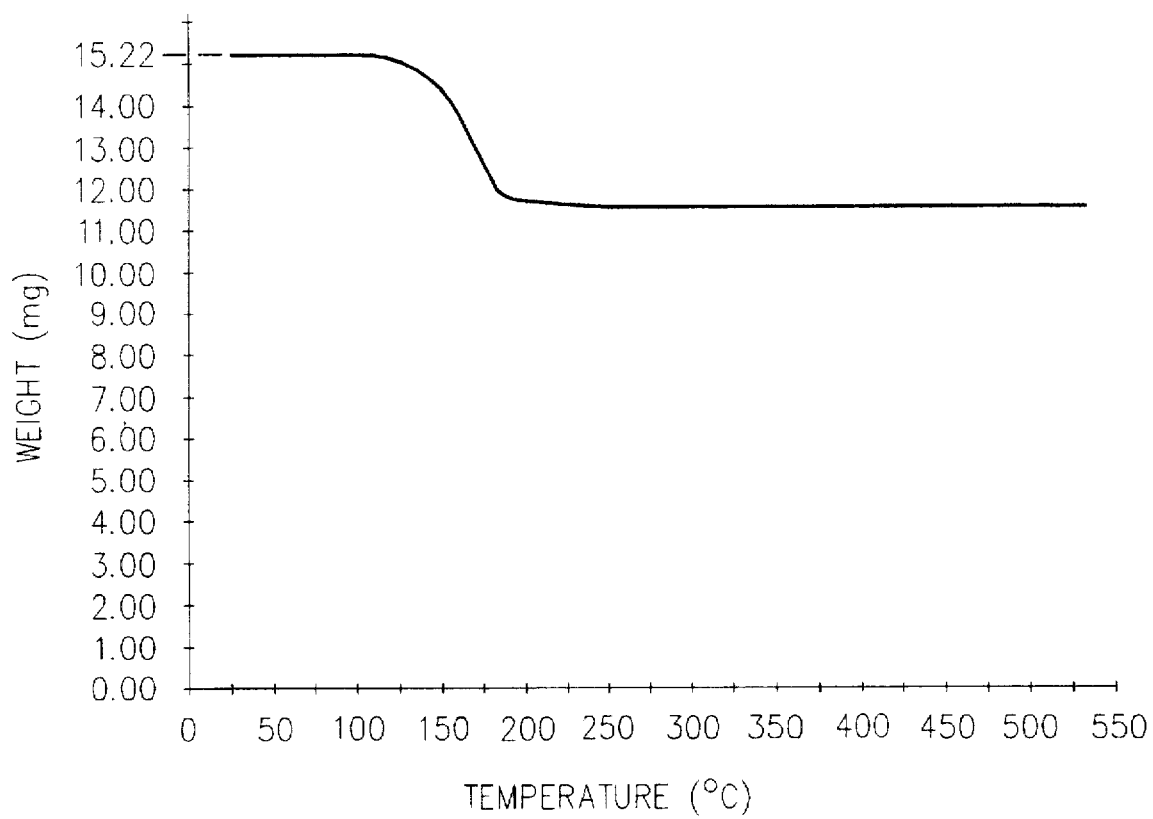
FIG. 1 is a chart showing thermogravimetric analysis for our $K_2Ni(SO_4)_2 6H_2O$ crystal.

We provide a $K_2Ni(SO_4)_2 6H_2O$ crystal useful for ultraviolet sensors and filters. Single crystals of $K_2Ni(SO_4)_2 6H_2O$ were grown by solution growth method. This method involved two steps.

A. Preparation of Saturated Solution

The solubility of $K_2Ni(SO_4)_2 6H_2O$ in water is relatively small but it is very difficult to grow large crystals from a pure water solution. We observed that solubility of $K_2Ni(SO_4)_2 6H_2O$ is reasonably high in an aqueous solution of hydrochloric acid. We used a mixture of HCl and water (30:70) as the solvent. A saturated solution was prepared at 45° C. by placing the solvent container in a water bath.

B. Crystal Growth

Crystal growth of potassium nickel sulfate hydrated crystal was carried out by lowering the temperature of the solution (LTS) method over a period of 300 hours. The saturated solution was placed in a thermostatically controlled chamber at 40° C. We programmed the thermostat to lower the temperature of the bath from 40° C. to 35° C. in 100 hours, from 35° C. to 30° C. in the next 100 hours, and from 30° C. to 25° C. in the last 100 hours. We used small pregrown $K_2Ni(SO_4)_2 6H_2O$ crystals for seeding. We were able to grow crystals a size which would allow a crystal of 2 cm in diameter to be fabricated. The pH of the solution was always kept below 6 to avoid crystallization of $KHSO_4$ in the bottom of the container.

Those skilled in the art will recognize that the times and temperatures which we used this method could be varied. However, we prefer to use temperatures within plus or minus 0.1° C. of those stated. Higher temperatures enable more starting material to be dissolved, but the water evaporates more rapidly. The dominant concern is to create a solution containing enough material to form a crystal of a desired size.

C. Characterization

The crystal composition was confirmed by matching the X-ray lines. We used the Phillips APD system to compare the X-ray lines with parent phases. We did not observe any additional phases in the grown crystal. The lattice parameters of the grown crystal based on a monoclinic cell were:

a=9.009 Angstroms b=12.179 Angstroms c=6.131 Angstroms

β=105° and the crystal was monoclinic. Thermogravimetric analysis was carried out to determine the stability of the crystal. We used a heating rate of 5° per minute in our experiment. The results are shown in FIG. 1. It is clear that the crystal did not start losing water before 110° C. Therefore, the crystal and devices made from the crystal can be expected to perform in temperatures below 110° C. Also, we carried out an independent test by placing the crystal in an oven maintained at 95° C. We did not observe any sign of deterioration after 50 hours at that temperature.

Figure 2:
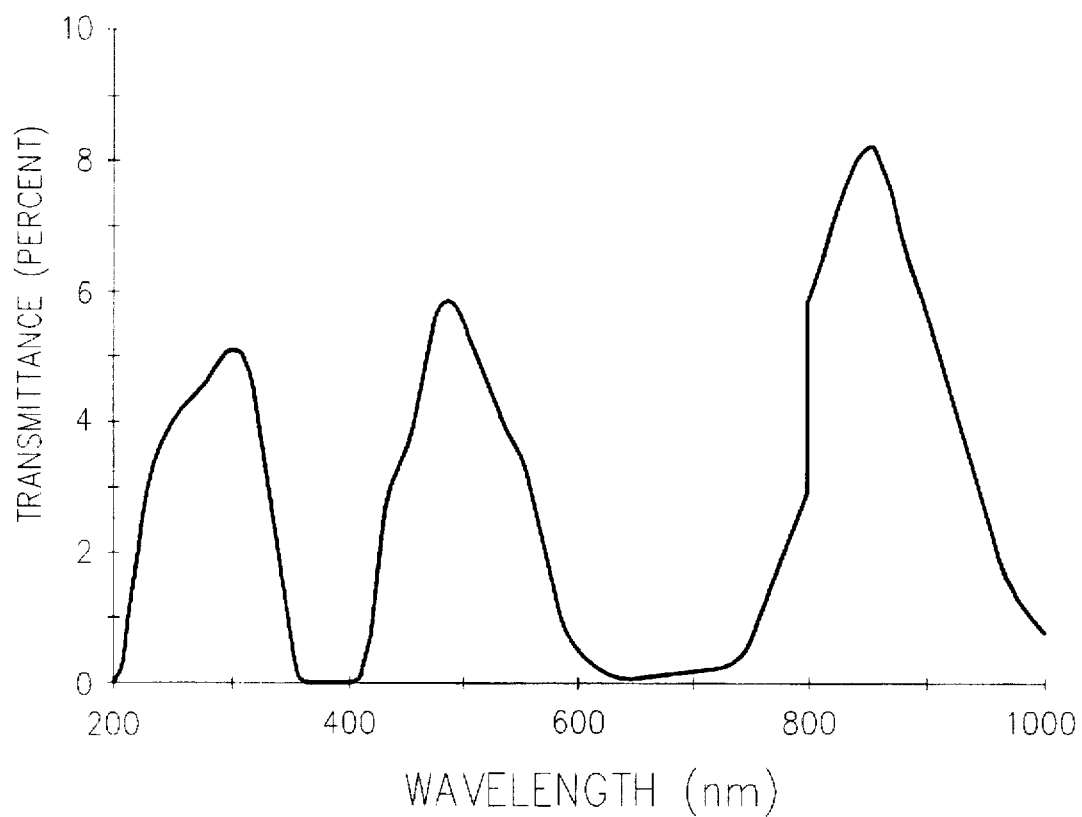
FIG. 2 is an ultraviolet light transmission curve for our $K_2Ni(SO_4)_2 6H_2O$ crystal.

The feasibility of desired transmission was evaluated by measuring the transmission of an $K_2Ni(SO_4)_2 6H_2O$ crystal using a Varian Cary-5 spectrophotometer. The results are shown in FIG. 2 and indicate that the $K_2Ni(SO_4)_2 6H_2O$ crystal is transparent in the ultraviolet range and absorptive at longer wavelengths. Based upon this data it is apparent that this crystal can be used in UV filters and sensors for missile warning systems. We attribute the optical properties to the fact that nickel is present in a cluster with six waters of hydration. It should, therefore, be possible to substitute other metal sulfate compounds such as alkali metal sulfates for the potassium sulfate and still achieve substantially the same optical properties.

Figure 3:
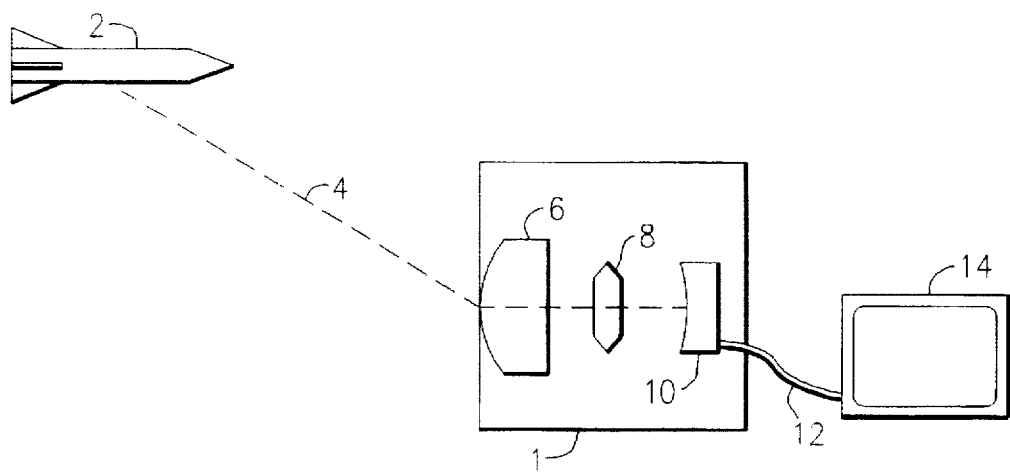
FIG. 3 is a diagram of a sensor device which uses the crystal.

FIG. 3 is a diagram of a sensing device 1 which utilizes the crystal of the present invention. A source of ultraviolet light 2 emits or reflects a beam of ultraviolet light 4 to the sensing device. The sensing device has an optical system 6 which directs the light to the crystal 8. The optical system 6 may be a single lens as shown in the figure or a series of lenses together with reflectors and filters. Typically, filters comprised of organic dyes in a polyvinyl alcohol plastic are used in this type of system. The beam of ultraviolet light strikes the $K_2Ni(SO_4)_2 6H_2O$ crystal 8 which permits passage of ultraviolet light rays having the required wavelengths. The transmitted ultraviolet light strikes a sensor 10 which generates a signal indicating the presence of the ultraviolet light. That signal is transmitted through wire 12 to an alarm or display device 14. The size of the crystal 8 will depend upon the particular sensing device. In a missile approach warning system a crystal of approximately one centimeter in thickness is used.

Although we have described certain present preferred embodiments of our crystal, methods of making the crystal and devices which utilize that crystal, it should be distinctly understood that our invention is not limited thereto, but may be variously embodied within the scope of the following claims.

We claim:

1. An ultraviolet light filter comprising a single crystal of the formula $K_2Ni(SO_4)_2 6H_2O$ which is stable above 85° C. and transmits ultraviolet light in the missile warning band and blocks light at longer wavelengths.

2. The crystal of claim 1 having a diameter of at least 2 cm.

3. An improved ultraviolet light sensing device of the type having a crystal which is stable above 85° C. and permits passage of wavelengths of ultraviolet light through the crystal and a means for generating a signal responsive to ultraviolet light passing through the crystal wherein the improvement comprises the crystal having a formula $K_2Ni(SO_4)_2 6H_2O$.

4. The improved ultraviolet light sensing device of claim 3 wherein the device is a missile approach warning system.

5. An ultraviolet light filter comprising a single crystal of a hexahydrate of nickel and an alkali metal sulfate which is stable above 85° C. and transmits ultraviolet light.

6. A method for growing $K_2Ni(SO_4)_2 6H_2O$ crystals comprising the steps of a. dissolving $K_2Ni(SO_4)_2 6H_2O$ in a solution of HCl and water to form a saturated solution;

b. lowering the temperature of the saturated solution by about 5° C.;

c. maintaining the saturated solution at that lowered temperature;

d. adding at least one seed crystal of $K_2Ni(SO_4)_2 6H_2O$ to the saturated solution;

e. lowering the temperature of the saturated solution to grow the seed crystal to a $K_2Ni(SO_4)_2 6H_2O$ crystal of a desired size; and f. removing the crystal of a desired size from the saturated solution.

7. The method of claim 6 wherein a 30:70 HCl and water solution is used.

8. The method of claim 6 wherein the temperature is lowered from about 40° C. to about 25° C. by performing the steps of:

a. lowering the temperature from about 40° C. to 35° C. over a first period of time;

b. lowering the temperature from 35° C. to 30° C. over a second period of time; and c. lowering the temperature from 30° C. to about 25° C. over a third period of time.

9. The method of claim 8 wherein the first, second and third periods of time are 100 hours.

10. The method of claim 6 wherein the saturated solution is maintained at a pH below 6.

* * * * *